(12) United States Patent
Uekubo

(10) Patent No.: US 6,191,979 B1
(45) Date of Patent: Feb. 20, 2001

(54) SEMICONDUCTOR MEMORY DEVICE WITH REDUCED PRECHARGING TIME FOR BIT LINES

(75) Inventor: Masaki Uekubo, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/399,749

(22) Filed: Sep. 20, 1999

(30) Foreign Application Priority Data

Sep. 22, 1998 (JP) .................................................. 10-267905

(51) Int. Cl.[7] .................................................. G11C 16/06
(52) U.S. Cl. .............................. 365/185.25; 365/185.2; 365/185.21
(58) Field of Search ........................ 365/185.25, 185.2, 365/185.21, 205

(56) References Cited

U.S. PATENT DOCUMENTS

| | | | |
|---|---|---|---|
| 5,555,217 | * 9/1996 | Hashimoto | 365/233.5 |
| 5,717,640 | * 2/1998 | Hashimoto | 365/189.07 |
| 5,757,697 | * 5/1998 | Briner | 365/185.21 |
| 5,946,238 | * 8/1999 | Campardo et al. | 365/185.2 |
| 5,986,937 | * 11/1999 | Yero | 365/189.21 |

FOREIGN PATENT DOCUMENTS 3-207096    9/1991   (JP) .

* cited by examiner

Primary Examiner—Richard Elms
Assistant Examiner—Tuan T. Nguyen
(74) Attorney, Agent, or Firm—Sughrue, Mion, Zinn, Macpeak & Seas, PLLC

(57) ABSTRACT

A semiconductor memory device having a bit line which is precharged quickly is disclosed. According to the presenti invention, a semiconductor memory device includes a bit line which is connected to a memory cell, a first precharging circuit which precharges said bit line during a first time period, and a second precharging circuit which precharges said bit line during a second time period, wherein said first time period being longer than said second time period.

9 Claims, 6 Drawing Sheets

SEMICONDUCTOR MEMORY DEVICE WITH REDUCED PRECHARGING TIME FOR BIT LINES

BACKGROUND OF THE INVENTION

1. Field of the Invention

The present invention relates to a semiconductor memory device, and more particularly to a semiconductor memory device provided with a current sensing read circuit.

2. Description of the Prior Art

Conventional semiconductor memory devices, particularly nonvolatile semiconductor memory devices, can roughly be classified into those with current sensing circuit and those with voltage sensing circuit. Of these the current sensing circuits is of the type which senses the on-current of the memory cell when the cell is energized. Referring to FIG. 6 which illustrates a semiconductor memory device employing a current sensing circuit, this semiconductor device includes a memory cell array 102, a column selector 103 which selects a bit line connected to a memory cell of the memory cell array 102; and a current to voltage converter circuit 280. This circuit 280 comprises an n-channel MOS transistor 203 serving as a transfer transistor with its source connected to the desired bit line selected by the column selector 103, an n-channel MOS transistor 202 serving as a load transistor which is inserted between the drain of the n-channel MOS transistor 203 and a power supply potential, and a dummy feedback circuit 270. The circuit 270 consists of a series connection of an n-channel MOS transistor 204 which receives a precharging signal SAE to its gate, and a circuit formed by a parallel connection of an n-channel MOS transistor 206 which also receives the signal SAE to its gate and an n-channel MOS transistor 205 which has its gate connected to bit line DLi of the memory cell, where the respective drains and the sources of the transistors 206 and 205 are connected in common, and the series connection point FBi serving as the output terminal of the circuit 270 is connected to the gate of the n-channel MOS transistor 203. Moreover, the memory device further comprises a reference array 106, a current to voltage converter circuit 281 for reference which is connected to a bit line DLR connected to a reference memory cell of a reference memory cell array via a switching transistor, and a voltage comparison type differential amplifier circuit 201 which compares output voltage VDi of the current to voltage converter circuit 280 with output voltage VREF of the current to voltage converter circuit 281. Here, the current to voltage converter circuit 281 for reference has the identical configuration with that of the current to voltage converter circuit 280.

The sense amplification operation of data read by the current sensing amplifier will be easy to understand when it is time sequentially classified into precharging period and sensing period. In the precharging stage in the first half, it is general to supply charges to the bit lines DLi and DLR to raise the potentials of these lines to predetermined levels lower than the power supply voltage.

After the bit line potentials are settled as a result of precharging, memory cells MC are selected to generate on-currents in the memory cells MC. The resulting changes in the bit line currents are transmitted to the feedback parts 270 and 271, the transfer transistors 203 and 213 that are controlled by these feedback parts, and the load transistors 202 and 212 for the transfer transistors to generate voltages corresponding to the selected desired memory cell currents.

The roles of the feedback parts 270 and 271 in this process are different in the precharging period in the first half and in the sensing period in the latter half, and the difference becomes conspicuous when an increase in the operating speed is attempted.

In short, in the precharging period in the first half, the speed by which the required charging of the parasitic capacitances of the bit lines DLi and DLR is achieved is an important issue.

In order to attain quick supply of charges by controlling the feedback circuits 270 and 271 in the precharging period, it is necessary to generate feedback signals FBi and FBR that can instantaneously supply large quantities of charges.

Since, however, the potentials of the bit lines DLi and DLR that are clamped by the feedback circuits 270 and 271 are at sufficiently lower levels than that of the power supply voltage, overprecharging is liable to occur if the charge supply capability is set too high.

Once an overprecharging takes place during read operation, there is no route for discharging the charges that are overprecharged to bring them down sufficiently close to the desired levels, so that the reading rate of data will have to be reduced contrary to the intention. In addition, the amplitudes of the voltages input to the feedback circuits 270 and 271 during the precharging are relatively large among all voltages involved in the read operation.

In contrast, during the sensing period in the latter half, it is desirable for stable sensing operation that the feedback outputs do not undergo too large variations with respect to the variations generated in the inputs (that is, the bit line potentials) of the feedback circuits 270 and 271 caused by the memory cells.

Fundamentally, larger amplification factors by the feedback circuits 270 and 271 will lead to raise the amplification factors of the current to voltage converter circuits 280 and 281. However, if one relies too much on the amplification factors of the feedback circuits 270 and 271, then the adverse effect during sensing of the feedback circuit operations acting as noise sources will become noticeable.

Under these circumstances, the feedback signals FBi and FBR for charge supply at precharging are required to show somewhat higher charge supply capability in the first half of the precharging period, while the charge supply capability needs be appropriately restrained in the latter half of the precharging period so as to be able to avoid overprecharging.

In contrast to this, during sensing, it is desirable to output the feedback signals so as not to be affected too much by the potential changes in the bit line.

In this case, the characteristics of the feedback parts 270 and 271 are set to satisfy the situation of an intermediate point between enhancement of the amplification factor and of suppression of overprecharging.

In order to optimize the series of operations to satisfy the intermediate situation mentioned above, it is desirable to set the characteristics of the feedback circuits 270 and 271 so as to vary optimally in the respective stages.

As another example of the conventional semiconductor memory device there may be mentioned the device disclosed in Japanese Patent Applications Laid Open No. Hei 3-207096.

In the semiconductor memory device described above, in the first half of the precharging period, it is necessary to generate feedback signals which are capable of supplying large quantities of charges instantaneously in order to perform control of charges necessary for charging the parasitic capacitances of the bit lines by means of the feedback circuits.

In this case, if the charge supply capability of the feedback circuits is set too high, the potentials of the bit lines are liable to be overprecharged. If overprecharging takes place once, there arises a problem that the rate of read is deteriorated in the reading operation since there is no route for discharging the charges to bring them down to the desired levels.

In contrast, during the sensing period in the latter half, it is desirable that the feedback outputs do not change too much relative to the changes in the bit line potentials generated by the memory cells. Moreover, if the amplification factors of the current to voltage converter circuits are raised too much by means of the feedback circuits, there arises a problem that the operations of the feedback circuits act as noise sources in the sensing operation.

SUMMARY OF THE INVENTION

It is the object of the present invention which was motivated in view of the drawbacks in the conventional device described above to provide a semiconductor memory device which enables one to set the charge supply quantities to the bit lines at bit line precharging to realize a high speed data read, by minimizing the charge supply losses, such as overprecharging of the bit lines, through change of the feedback signal for precharging period from that for the sensing period.

A semiconductor memory device according to the present invention includes a bit line which is connected to a memory cell, a first precharging circuit which precharges said bit line during a first time period, and a second precharging circuit which precharges said bit line during a second time period, wherein said first time period being longer than said second time period.

The feature of the present invention is to provide a semiconductor memory device provided with a current sensing data read means in which, at precharging, when a precharging signal is activated in the state where a sense amplifier activation signal is activated, bit line potential is raised to a desired level necessary for the sensing, then a specified memory cell is selected from the memory cell array to generate an on-current. The output voltage obtained by converting the current by a current to voltage conversion means equipped with a feedback means which feedback-inputs the current change is compared with the output voltage of a reference voltage generation means with the identical configuration as that of the current to voltage conversion means in a differential amplifier means, to decide the data storage state of the memory cell in a sensing period where the precharging signal is deactivated. The semiconductor memory device further includes a dummy current to voltage conversion means which controls dummy cells having the identical configuration to memory cells of one column of the memory cell array and a transfer transistor which supplies charges to the cells using a dummy feedback means which inputs the output potential of the transistor through feedback, and increases or decreases the charge supply to the dummy memory cells as well as generates a specified voltage in response to the change in the charge supply from a load transistor of the transfer transistor, and a charge supply control means which controls to shorten the time required for the charge supply of the current to voltage conversion means by the dummy current to voltage conversion means.

BRIEF DESCRIPTION OF THE DRAWINGS

The above and other objects, features and advantages of the present invention will be more apparent from the following description taken in conjunction with the accompanying drawings.

DESCRIPTION OF THE PREFERRED EMBODIMENTS

Figure 1:
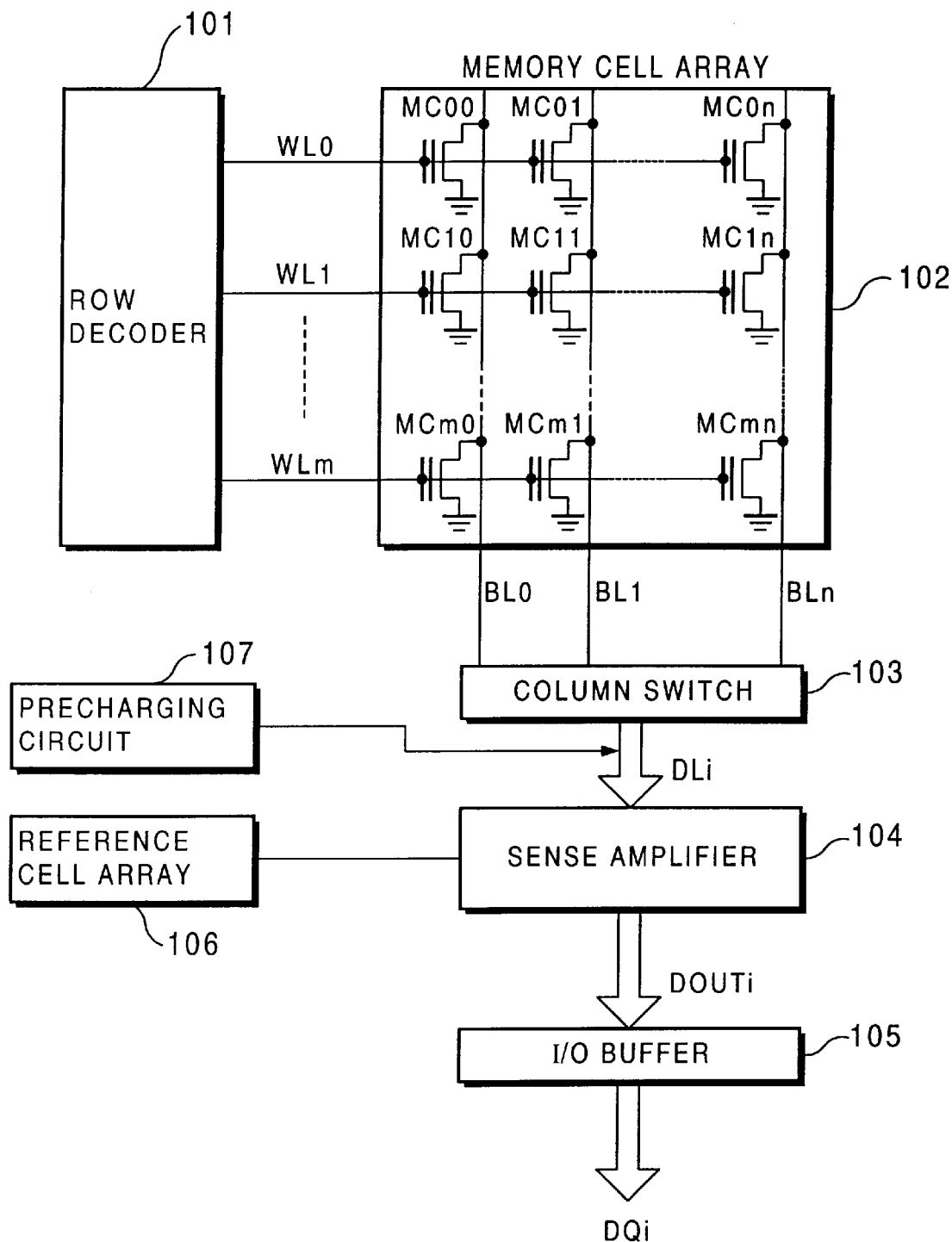
FIG. 1 is an overall block diagram of the semiconductor memory device showing a first embodiment of the present invention.

To summarize the present invention, charges are supplied by means of a precharging circuit (charge supply control means) which is provided with, in addition to bit lines to be charged up originally and an accompanying feedback circuit, dummy bit lines and a dummy feedback circuit equivalent to or similar to the original components.

The bit lines to be charged up are provided with a precharging circuit which assists the charge-up at the initial stage of data read where the precharging circuit is controlled by means of the output signal of the dummy feedback circuit. Since the quantity of charge supply to the bit line at precharging the bit line can be set at an arbitrary level in this way, loss in charge supply such as overprecharging of the bit line can be minimized.

Next, referring to the drawings, the embodiments of this invention will be described.

FIG. 1 is a block diagram of the semiconductor memory device showing a first embodiment of this invention. As shown in FIG. 1, this device comprises a row decoder 101 which outputs the row addresses of memory cells MC00 to MCmn via word lines WL0 to WLm based on the address signals given from the outside, a column switch 103 which inputs the column addresses of the memory cells MC00 to MCmn via bit lines BL0 to BLn, and selects a desired bit line to output its data via a bit line DLi, a precharging circuit 107 which precharges the bit line DLi having output data of the column switch 103, a reference cell array 106 which supplies charges on the reference memory cells for generating a reference voltage used for a sense amplifier, a current sense type sense amplifier 104, and an input/output buffer 105 which inputs the output data of the sense amplifier 104 via a data output line DOUTi and outputs it to an output terminal via a data output line DQi.

Figure 2:
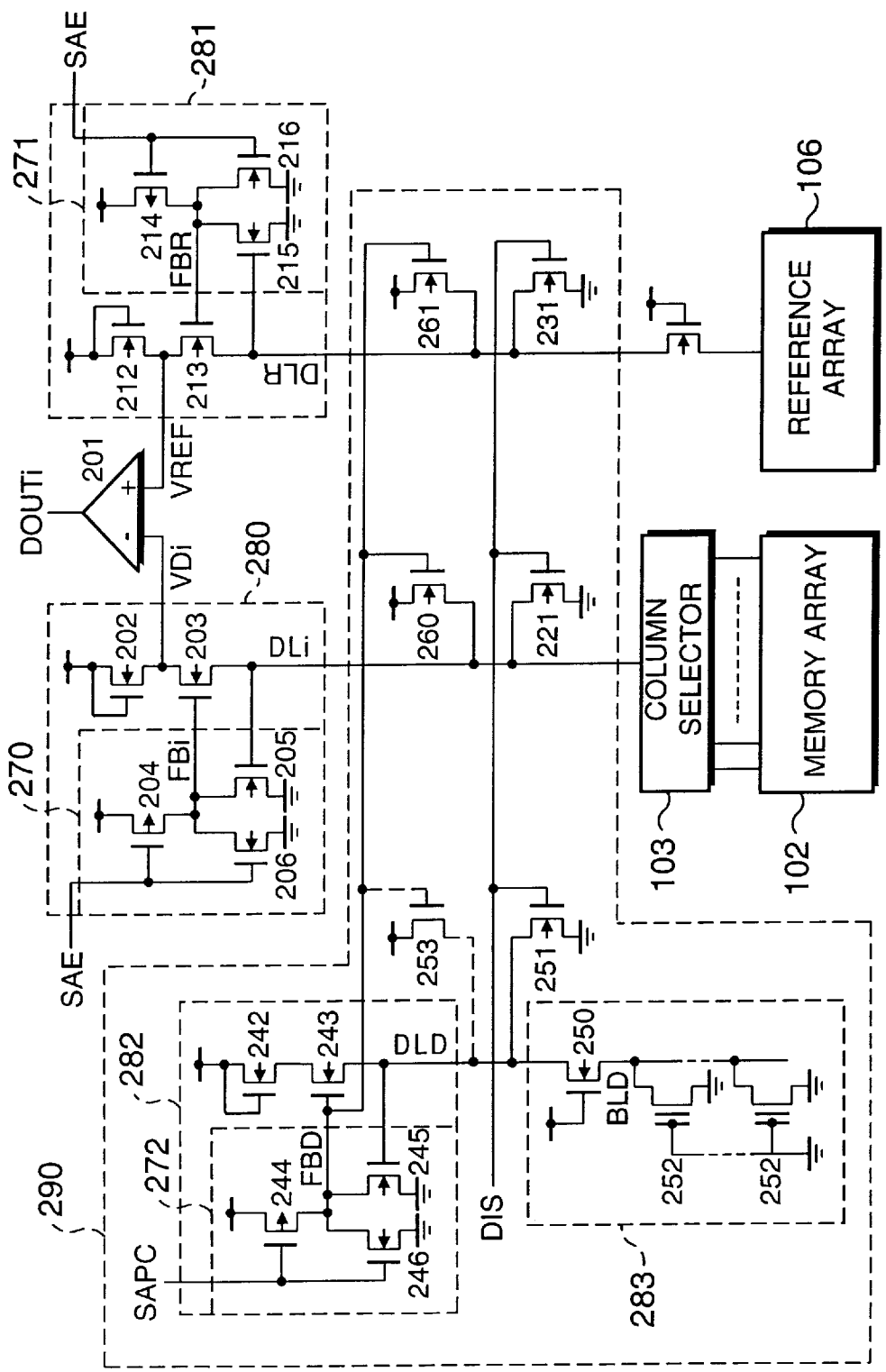
FIG. 2 is a block diagram of a sense amplifier showing the first embodiment.
Figure 6:
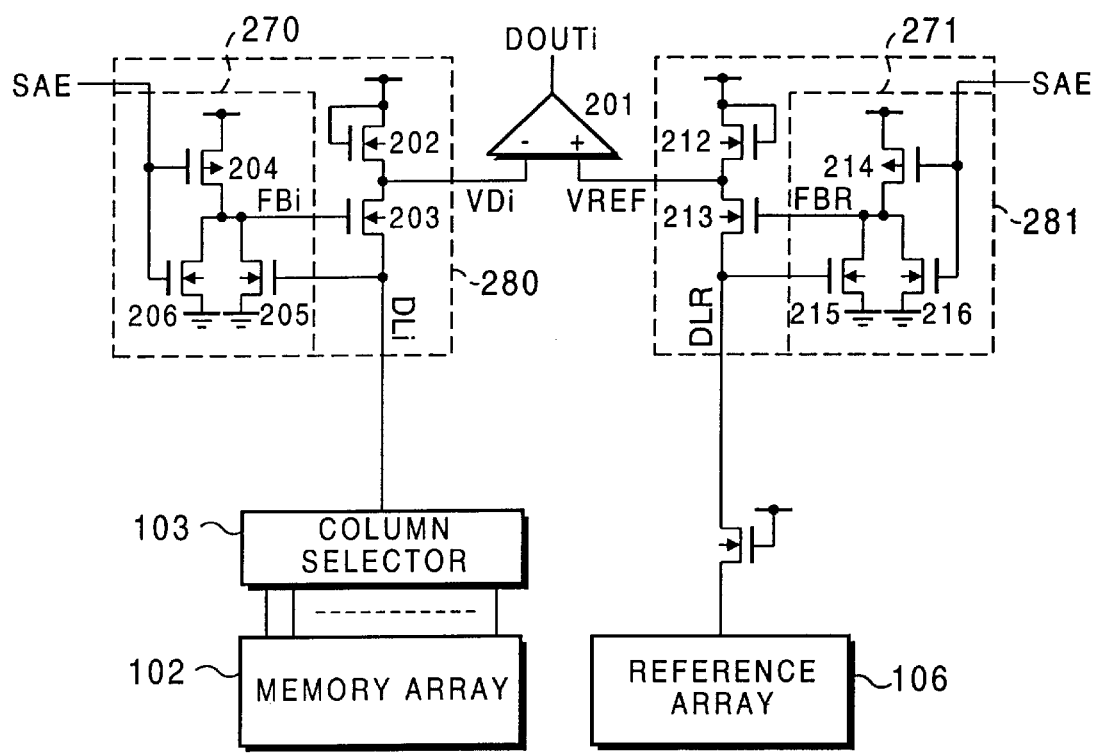
FIG. 6 is a block diagram showing an example of the sense amplifier of the conventional semiconductor integrated circuit.

Referring to FIG. 2 which shows the configuration of the sense amplifier 104, the difference of this device from the conventional device shown in FIG. 6 resides in the fact that there is newly added a current supply control means 290 to the configuration shown in FIG. 6. Accordingly, the configuration of the charge supply control means 290 alone will be described in detail in the following, touching only lightly on the description of the conventional constituent components.

It is to be noted that the description that follows will apply to both of the memory cell array and the reference cell array unless otherwise noted.

Referring again to FIG. 2, at precharging where sense amplifier precharging signal SAPC is activated while the sense amplifier enabling signal SAE is activated, the potential of the bit line DLi is raised to a desired level necessary for sensing. Then, a specified memory cell is selected from the memory cell array 102 to generate an on-current. The output voltage VDi obtained by converting the generated current using the current to voltage converter circuit 280 which is equipped with a feedback circuit 270 that inputs the change in the current by feedback, is compared in the differential amplifier part 201 with the output voltage VREF of the reference voltage generating means 281 (referred to as current to voltage converter circuit 281 hereinafter) having the identical configuration as that of the current to voltage converter circuit 280. The above process is applied to a conventional memory device provided with a current sensing data read means which decides the data storage condition of the memory cell during the sensing period where the precharging signal SAPC is deactivated.

The charge supply control means (referred to as dummy precharging circuit hereinafter) 290 comprises a dummy memory cell 283 having the identical configuration to one column of memory cells of the memory cell array (referred to as memory array hereinafter) 102, a dummy current to voltage converter circuit 282 connected to a bit line DLD of the dummy memory cell 283, and a group of n-channel MOS transistors 251, 221, and 231 serving as discharge paths (referred to as dedicated paths to discharging hereinafter) which are arranged to respective one of the bit lines DLD, DLi, and DLR that are respectively connected to reference memory cells (referred to as reference cells hereinafter) of the reference memory cell array (referred to as reference array hereinafter) 106 connected to the dummy memory cell 283, the memory cell, and the current to voltage converter circuit 281, where the drains of these transistors are connected respectively to the bit lines DLD, DLi and DLR, the sources are connected to the ground potential, and the gates receive the discharge control signal SAPC. The dummy precharging circuit 290 further comprises a group of n-channel MOS transistors 260 and 261 serving as precharge paths (referred to as dedicated paths to charging hereinafter) arranged separately to the bit lines DLi and DLR of the memory cell and reference cell, where the gates of these transistors are connected to an output terminal FBD of a dummy feedback circuit 272, the drains are connected to the power supply potential, and the sources are connected to the respective bit lines. The dummy current to voltage converter circuit 282 consists of the dummy feedback circuit 272 which is inserted between the power supply potential and the ground potential in serially connected state, consists of a p-channel MOS transistor 244 and an n-channel MOS transistor 246 both receiving the precharging signal SAPC to their gates, and an n-channel MOS transistor 245 with its gate connected to the bit line DLD of the dummy memory cell 283, and connected in parallel with an n-channel MOS transistor 246, with their drains and their sources connected in common, and uses the drain of the n-channel MOS transistor 245 as an output terminal FBD; an n-channel MOS transistor 243 serving as a transfer transistor which has its gate connected to the output terminal FBD and its source connected to the bit line DLD of the dummy memory cell 283; and an n-channel MOS transistor 242 serving as a load transistor which is inserted between the drain of the n-channel MOS transistor 243 and the power supply potential.

In this invention, dedicated transistors 260 and 261 to charging serving as dedicated paths for charging the bit line DLi are provided anew, and it has a new feature that their control is performed by the output FBD of the dummy precharging circuit 290.

In addition, as the connection is indicated by a broken line in the figure, an n-channel MOS transistor 253, which has its gate connected to the output terminal FBD, its drain connected to the power supply potential, and its source connected to the bit line DLD of the dummy memory cell 283, may be provided as a dedicated transistor to charge a dedicated path to charging for the dummy feedback circuit.

As described in the above, the dummy memory cell 283, in addition to the memory cell MC and the reference cell, is newly provided in this embodiment, and a circuit (dummy current to voltage converter circuit) 282 which carries out current to voltage conversion analogous to the cases of the memory cell MC and the reference cell is assigned to the cell 283.

The dummy bit line DLD is prepared in advance so as to have smaller parasitic components (resistance and capacitance) compared with those of the bit line DLi of the memory cell or the bit line DLR of the reference cell.

Moreover, it will be assumed that the properties of the dummy feedback circuit 272 are modified to have higher decision current than those used for the memory cell MC and the reference cell, and the charging capability is enhanced within the range of the potential which does not exceed (namely, does not cause overcharging) the desired bit line potential.

Furthermore, as the paths for supplying charges to the bit line DLi of the memory cell MC and the bit line DLR of the reference cell, dedicated transistors for charging 260 and 261 are respectively provided newly in addition to the transfer transistors 203 and 213. The output FBD of the dummy feedback circuit 272 used for the dummy current to voltage converter circuit 290 is also used for the control of the dedicated transistors 260 and 261 in addition to the control of the transfer transistor 243 of the dummy current to voltage converter circuit 290.

Next, referring to FIGS. 1 and 2, the operation of the semiconductor device with the above constitution will be described.

Since the memory cell array 102 has a matrix-like arrangement in the row direction and column direction, reading of memory cell data is performed by selecting either one of the memory cells MC00 to MCmn by controlling both of the word lines WL0 to WLn that are the outputs of the row decoder 101 and the column switch 103. The selected cell MC is output to the sense amplifier 104 via the bit line DLi.

The bit line DLi connected to the memory cell is clamped to a specified potential lower than the power supply potential by the current sense type sense amplifier 104, and when the desired selected word line WL attains the power supply potential or a specified high potential, the selected memory cell transistor is energized if it is a transistor whose floating gate is injected with electrons in advance, and the charge on the bit line DLi is discharged consistently to the ground potential by this memory cell. In other words, the bit line DLi goes to "0" level, and the sense amplifier 104 outputs the "0" as data that are read out.

On the other hand, if the floating gate of the selected memory cell transistor is a transistor to which electrons are not injected, it is deenergized, giving rise to no discharge by this memory cell, and the charge of the bit line DLi is held constantly. In other words, the bit line DLi goes to "1" level, and the sense amplifier 104 outputs this "1" as the data that are read out.

The sense amplifier 104 is provided with a feedback circuit 270 for clamping the bit line DLi at a constant potential, and a transfer transistor 203 for keep supplying charge to the bit line by receiving the output of the circuit 270. The feature of the feedback circuit 270 is to generate a relatively high output potential in the range below the power supply voltage to supply charge to the bit line DLi when the potential of the bit line DLi is not attaining a specified high level, and acts in the direction to increase the charge supply capability of the transfer transistor 203.

On the contrary, when the potential of the bit line DLi is higher than a desired low potential, the feedback circuit 270 outputs somewhat lower potential to reduce the potential of the bit line to the desired low value, opposite to the above, to control the charge supply capability of the transfer transistor 203, and acts to reduce or stop the supply of the charge to the bit line DLi.

That is, in the state where a constant-current circuit is formed by the feedback circuit 270, the transfer transistor 203, and a memory cell MC in the state where a prescribed potential is applied to the word line WL, the constant current is allowed to flow in the load transistor 202, to generate a level where a voltage is dropped from the power supply voltage.

As a result of the operating principle described above, a voltage is output by the load transistor 202 according to a current value generated by the memory cell MC in response to the data storage state, in the state where a voltage is applied to the word line WL, and the function as a current to voltage converter of the circuit 280 is realized.

The data storage state of the memory MC can be decided by comparing the output state of the voltage VDi which is obtained by converting the drain current generated by the MC using the current to voltage converter circuit 280, with the reference voltage VREF.

The output voltage VDi and the reference voltage VREF are input to, and compared by the voltage input type differential amplifier 201 to decide the data storage state.

For generation of the reference voltage VREF a memory cell or an n-channel MOS transistor is generally used as a reference cell. In the same way in which the drain current of the memory cell MC is converted into the voltage VDi in the above, the drain current of the reference cell is converted into a voltage and is used as the reference voltage VREF.

In this case, it is desirable to give the parasitic components that are generated in the bit line or the like as close to those of the memory cell as are possible. This is because the contributions from the parasitic components can be made to cancel with each other at the differential decision.

Figure 3:
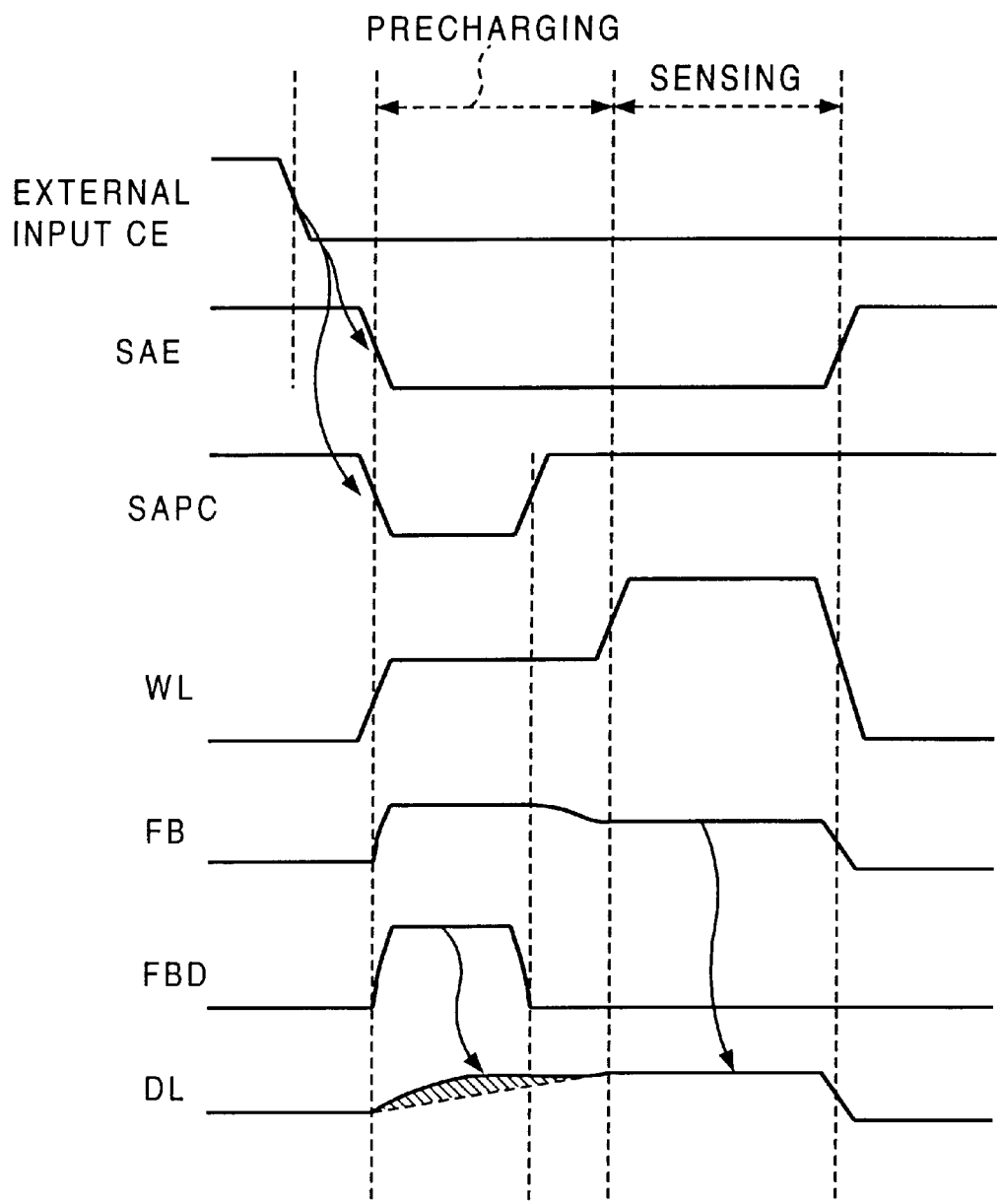
FIG. 3 is a diagram showing the input signal and internal operating waveforms.
Figure 4:
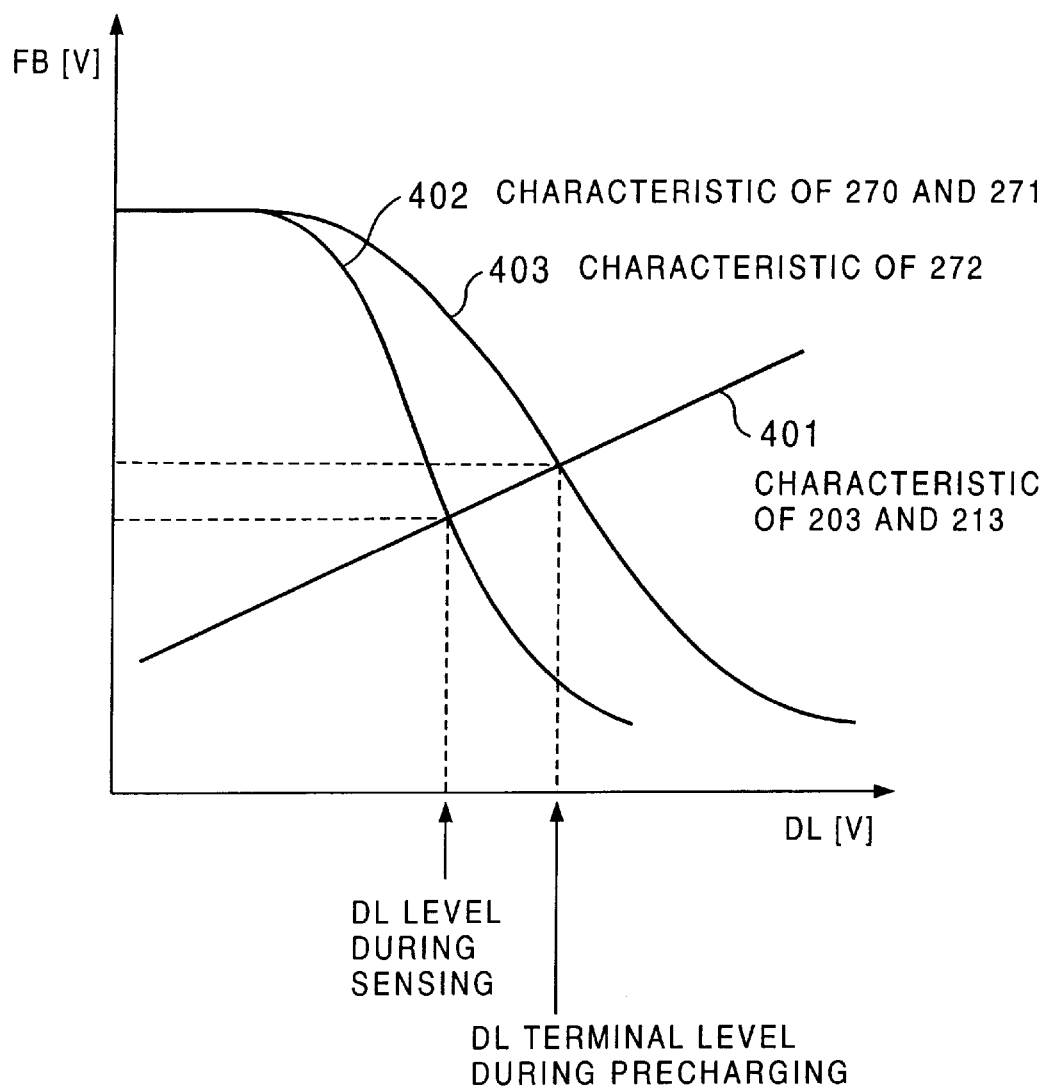
FIG. 4 is a diagram showing the waveforms for describing the operating points.

Next, referring to FIG. 3 showing the input signal and the internal operating waveforms and FIG. 4 showing the waveform diagram for describing the operating points, the circuit operation of the charge supply means provided with a dummy current to voltage converter circuit will be described.

Referring to FIG. 3, it can be seen that respective pulse waves of the sense amplifier enabling signal SAE and the precharging signal SAPC are generated and supplied by a timing generating circuit (not shown) such as an address transition detector (ATD) with the read of the memory cell of an external input (chip enabling) signal CE as a starting point.

After both of the sense amplifier enabling signal SAE and the precharging signal SAPC are activated (sent to the low level of the logic level) by such a timing generation circuit as an ATD, the precharging signal SAPC returns to the deactivated state (the high level of the logic level) sooner than the sense amplifier enabling signal SAE does.

In this case, the bit lines DLi and DLR return to the state of the precharging period somewhat delayed than the activated state of the precharging signal SAPC, and over the period from the precharging period up to the deactivation of the sense amplifier enabling signal SAE, the device goes to the state of sensing period in which the differential amplifier part 201 can perform the decision.

The word line WLi (WL in FIG. 3) of the memory cell is actuated in synchronism or in asynchronism with the operation of the timing generation circuit ATD. The word line WLi in this case is sent to a boosted level in response to the power supply voltage either to the level of the power supply voltage (precharging period) or a level higher than that (sensing period).

During the precharging period, speeding-up of operation, such as reading, of the sense amplifier depends on the speed of charging the level of the bit line DLi to the desired level necessary for the sensing. For this reason, the optimization of the precharging time in this invention is attained by optimizing the speed of the precharging operation.

Normally, in supplying charge to the bit line DLi or DLR, the feedback circuit 270 or 271 which generates its control signal FBi or FBR is set by giving priority to clamp the bit line to the desired potential during sensing.

In such a case, in the initial stage of the precharging period, the precharging capability of the bit lines DLi and DLR tends to be insufficient. Thus, it is only necessary to shorten the precharging time of the bit lines DLi and DLR by generating and utilizing a dummy feedback signal FBD in order to temporarily enhance the precharging capability only in the precharging stage.

Referring to FIG. 4, there are given curves illustrating the input/output characteristic 402 of the feedback circuits 270 and 271 which operate with the bit line level as the input, and the input/output characteristic 403 of the dummy feedback circuit 272. In addition, the intersections of the input/output characteristic 401 of the transfer transistors 203 and 213, and the input/output characteristic 402 of the feedback circuit and the input/output characteristic 403 of the dummy feedback circuit show the converging levels of the bit line DL and the feedback circuit output infinite time later.

In this invention, during the precharging stage the output of the feedback circuits of the system is dominated by the curve 403 which has a stronger driving force of precharging than the curve 402, and the precharging level of the bit line DL, the feedback outputs FB and FBD change with the lapse of time as shown in FIG. 3.

That is, reference to both FIG. 3 and FIG. 4, when, for example, the cell selected by the word line WL has undergone electron injection in advance and the deenergized cell outputs data "1" (potential of the bit line DL being (1V+α)), in the initial stage of precharging where the precharging signal SAPC is activated, the dummy feedback signal FBD goes to the high level and the transistors 260 and 261 dedicated to charging of the dedicated paths for charging are energized, and the bit line DL connected to the drain of the cell is charged rapidly to the power supply potential. Namely, the charging capability of the device is enhanced by the dedicated paths for charging.

As a result of this charging, the transistors 205 and 215 of the feedback circuits 270 and 271 are energized and the signal FB goes to the low level. The low level of FB deenergizes the transfer transistors 203 and 213, and the respective outputs VDi and VREF output voltages that are lower than the power supply potential by respective threshold voltages from the load transistors 202 and 212. Here, the system is arranged so as to satisfy the condition VDi ((−) input terminal)<VREF((+) input terminal). These two voltages are compared in the differential amplifier part 201 and the result is output as data "1".

When the device is further provided with the n-channel MOS transistor 253 mentioned above as a dedicated path for charging for the dummy feedback circuit, the transistor 245 of the dummy feedback circuit 272 is energized and FBD goes to the low level by the charging of the dedicated path for charging, conforming to the operation in the above. As a result of the low level of FBD, the transfer transistor 243 is deenergized.

On the other hand, when the cell is not subjected to electron injection in advance and outputs data "0", in the state where the precharging signal SAPC is activated, the dummy feedback signal FBD goes to the high level and the transistors 260 and 261 of dedicated paths for charging are energized, and the bit line DL connected to the drain of the cell is urged to be charged to the power supply potential. However, the potential of the bit line DL is (1V−α) and stays at the low level of the logic level since the cell is energized, and because of this low level, the transistors 205 and 215 of the feedback circuits 270 and 271 are deenergized, and FB goes to the high level.

The transfer transistors 203 and 213 are respectively energized by this high level, and the potential of the output VDi becomes equal to (power supply potential VCC)−(resistance of the load transistor 202)×(current flowing in the load transistor) and gives low level as the output, while low level is obtained analogously for VREF (however, the resistance of the load transistor 212 and the current flowing in the load transistor have different values). Here, the device is set so as to satisfy VDi((−) input terminal)>VREF((+) input terminal). These voltages are compared in the differential amplifier 201 and the result is output as data "0".

In other words, when data "1" is output, during the precharging period, precharging proceeds toward the terminal level of DL (the hatched portion in the waveform for DL in FIG. 3). However, when the precharging of the bit line is completed effectively and the precharging signal SAPC returns to the inactive state, FBD goes to low level, the transistors 260 and 261 of dedicated paths for charging are deenergized, and the level of the bit line DL changes toward the originally targeted DL level for sensing.

In this manner, speed of reading operation can be increased by the optimization of the characteristics of the dummy feedback circuit and the optimization of the precharging signal.

In the precharging operation according to this invention, if the parasitic components (resistance and capacitance) of the dummy bit line DLD are equal to those of the bit lines of the memory cell array 102 and the reference cell array 106, then an overprecharging is liable to occur, and there arises a possibility of causing deterioration in the characteristics of the device.

In order to prevent this, it is only necessary to make the parasitic components belonging to the bit lines DLi and DLR to be smaller than the parasitic components belonging to the dummy bit line DLD. By so doing, it is possible to suppress the overprecharging characteristics.

In addition, in order to adjust the initial state consistent, it is effective to discharge all the charges on the bit lines DL and DLD during the state in which the sense amplifier is disabled. Because of this, it is possible to adjust the state at the start of precharging by arranging to discharge the bit lines by means of a discharging signal DIS which synchronizes with the sense amplifier precharging signal SAPC that is controlled by ATD during the period where SAPC is in the inactive state. Such a discharge may be accomplished by means of the transistors 221 and 231 dedicated to discharging.

As in the above, according to this invention, by arranging the feedback circuit used in the sense amplifier to operate optimally in the respective stages, namely, the precharging and sensing stages, of two, it is possible to realize parameter fitting for increasing the speed of operation in the respective stages in a manner independent with each other. Accordingly, overall speed-up of the reading operation can be achieved.

Figure 5:
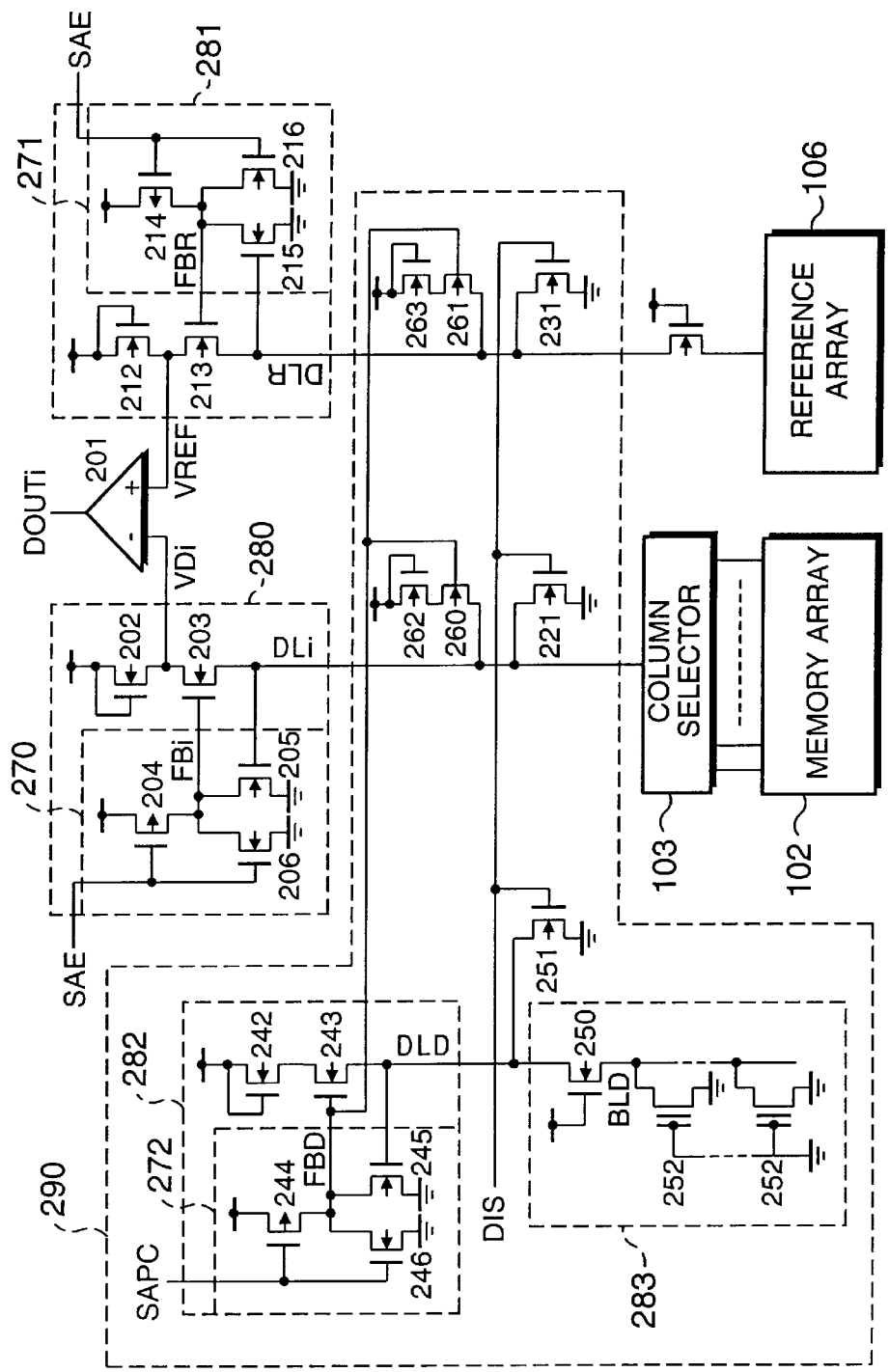
FIG. 5 is a block diagram of the sense amplifier showing a second embodiment.

Referring to FIG. 5 showing another embodiment of this invention, the difference from the first embodiment shown in FIG. 2 resides in the point that load transistors 262 and 263 are added to the path transistors 260 and 261 dedicated to charging. The other constituent components are identical, so description of the configuration will be omitted here.

When precharging of the bit line DL is conducted using the path transistors 260 and 261 dedicated to charging, if the power supply voltage is set too high, charging takes place rapidly, which may act as a noise source and may become a factor for inducing malfunctions in other circuits.

For such a power supply voltage, it is recommended to insert load resistance transistors 262 and 263 on the source or drain side of the path transistors 260 and 261 dedicated to charging in order to restrain the maximum value of the rate of charge supply (the time derivative of the current).

The best result for the charge supply capability or the transistor size of the load resistance transistors 262 and 263 is obtained when they are made identical to those of the load resistance transistors 202 and 212 of the current to voltage converter circuits 280 and 281.

As has been described in the above, the semiconductor memory device according to this invention includes a dummy current to voltage conversion means which controls a dummy memory cell with a configuration identical to that of a memory cell having one column component of a memory cell array and a transfer transistor supplying charge to this cell, by means of a dummy feedback means which receives the output potential of the transfer transistor by feedback, increases or decreases charge supply from a load transistor of a transfer transistor, and generates a specified voltage in response to the change in charge supply from the load transistor of the transfer transistor. Since the memory device further includes a current supply control means which controls to shorten the time required for charge supply to the current to voltage conversion means by means of the dummy current to voltage conversion means, it is possible to induce optimal operation to each of two, namely, precharging and sensing, stages of a feedback circuit used for a sense amplifier, making it possible to realize parameter fitting for increase of operating speed for each stage in a manner independent with each other. Accordingly, an increase in the speed of overall reading operation can be realized.

It is apparent that the present invention is not limited to the above embodiments, but may be modified and changed without departing from the scope and spirit of the invention.

What is claimed is:

1. A semiconductor memory device, comprising:
  a bit line which is connected to a memory cell;
  a first precharging circuit which precharges said bit line during a first time period; and
  a second precharging circuit which precharges said bit line during a second time period, said first time period being longer than said second time period.

2. The semiconductor memory device as claimed in claim 1, wherein said first and second time periods start substantially same time.

3. The semiconductor memory device as claimed in claim 1, wherein said memory cell is non-volatile type.

4. The semiconductor memory device as claimed in claim 1, wherein said first precharging circuit includes a first feedback circuit to retain said bit line at a first predetermined voltage.

5. The semiconductor memory device as claimed in claim 4, further comprises a sense amplifier, said first precharging circuit further including a first load element connected between said sense amplifier and a voltage supply line and a first transfer transistor connected between said sense amplifier and said bit line, said first feedback circuit supplying a first feedback voltage to a gate electrode of said first transfer transistor based on a voltage of said bit line.

6. The semiconductor memory device as claimed in claim 5, further comprises a dummy bit line, said second precharging circuit including a second load element, a second transfer transistor, a second feedback circuit, and a precharge element, said second load element and said second transfer transistor is connected in series between said voltage supply line and said dummy bit line, said second precharging circuit generating a second feedback voltage to a gate electrode of said second transfer transistor based on a voltage of said dummy bit line, said precharge element is controlled to precharge said bit line based on said second feedback voltage.

7. The semiconductor memory device as claimed in claim 6, wherein said first precharging circuit is activated in response to a first control signal, said second precharging circuit being activated in response to a second control signal different from said first control signal.

8. The semiconductor memory device as claimed in claim 6, wherein said bit line and said dummy bit line have a first and second parasitic capacitances, respectively, said second parasitic capacitance being smaller than said first parasitic capacitance.

9. In a semiconductor memory device provided with a current sensing data read means which selects a specified memory cell from a memory cell array and generates an on-current in it after raising a bit line potential to a desired level necessary for sensing, at the time of precharging in which a precharging signal is activated in the state where a sense amplifier enabling signal is activated, and an output voltage obtained by converting the current using a current to voltage conversion means provided with a feedback means which inputs the change in the current by feedback, is compared in a differential amplifier means with an output voltage of a reference voltage generation means having the identical configuration with said current to voltage conversion means, to decide the data storage condition of the memory cell during sensing period where the precharging signal is deactivated, the semiconductor memory device characterized in that said semiconductor memory device includes a dummy current to voltage conversion means which controls a dummy memory cell having identical configuration with a memory cell equivalent to one column component of said memory cell array and a transfer transistor which supplies charge to the cell with a dummy feedback means which inputs the output potential of the transistor by feedback, and increases or decreases charge supply to said dummy memory cell as well as generates a specified voltage in response to the change in said charge supply from a load transistor of said transfer transistor, and is further provided with a charge supply control means which controls to shorten the time required for said charge supply to said current to voltage conversion means with said dummy current to voltage conversion means.

* * * * *